United States Patent [19]

Jones

[11] 4,222,737
[45] Sep. 16, 1980

[54] BURN-IN TRAYS FOR SEMICONDUCTOR CIRCUITS

[76] Inventor: Elmer R. Jones, 124 Chestnut St., North Reading, Mass. 01854

[21] Appl. No.: 5,580

[22] Filed: Jan. 22, 1979

[51] Int. Cl.² .............................................. F27D 5/00
[52] U.S. Cl. ................................... 432/253; 206/503; 432/258
[58] Field of Search .................. 432/6, 253, 258, 261; 34/192, 237; 206/503, 507

[56] References Cited

U.S. PATENT DOCUMENTS

| | | | |
|---|---|---|---|
| 1,832,442 | 11/1931 | Anderson | 432/258 |
| 2,738,564 | 3/1956 | Guinane | 432/258 X |
| 2,807,454 | 9/1957 | Beadle | 432/261 |

*Primary Examiner*—John J. Camby
*Attorney, Agent, or Firm*—Richard L. Stevens

[57] ABSTRACT

Nestable burn-in trays for semiconductor circuits are provided. The trays are stackable thereby eliminating the need for special storage cabinets. Further the trays are designed not to tilt when being inserted or removed from a burn-in chamber preventing damage to the components on the tray.

6 Claims, 5 Drawing Figures

BURN-IN TRAYS FOR SEMICONDUCTOR CIRCUITS

BACKGROUND AND BRIEF SUMMARY OF THE INVENTION

Integrated circuit test systems for component testing in a burn-in chamber are well known; for example semiconductor life tests in burn-in chambers are common. The process of burning-in typically consists of applying a load to the components being tested at elevated temperatures. This allows identification of weak or faulty components and thus precludes their ultimate use such as in a computer system. The burn-in chambers generally comprise a plurality of paired opposed tracks which carry the burn-in trays, connectors and a power supply.

Integrated circuit boards including connectors, sockets, etc. are secured to the burn-in trays. The sockets may be longitudinally bussed to a ribbon plug as is well known. There may be positioned within the socket any number of elements to be tested for example semiconductor devices.

The burn-in trays which carry the boards are generally rectangular in shape with open bottoms and simply slide on the paired tracks in the burn-in chamber.

The prior art burn-in trays are subject to various problems. With the open bottom care must be taken in placing the trays on a surface to prevent an object from striking the board or the components secured to the board. More importantly, the burn-in trays require special cabinets for storage which adds to the total cost of the burn-in process.

Additionally when the trays are being inserted into a burn-in chamber if they are not carefully handled they will tilt causing the components secured to the board to strike an above tray, or the tilted tray will strike the components of a lower tray resulting in damage. Further when a tray is disengaged from a connector, which is typically located on the rear wall of the burn-in chamber, there is a tendency to lift the burn-in tray prior to disengaging and this results in damage both to the plug mating with the connector and the connector.

My invention overcomes all these prior art difficulties and provides a stackable floored tray which eliminates the need for a separate storage cabinet. Further the tray is structured to prevent tilting when inserted into or when removed from a burn-in chamber.

My invention broadly comprises a burn-in tray adapted for nesting with like trays and structured to insure movement only in a plane substantially parallel to the plane in which lie the parallel opposed tracks in the burn-in chamber.

In one embodiment my invention comprises a burn-in tray with a floor having a one end and another end and opposed sides, upwardly extending walls joined to the ends by bends, the bend characterized by at least one opening therein. The upper edges of the walls include tab members, each tab member having a cammed surface which surface is adapted to engage the opening in the bend of a next succeeding tray. Thus the tab is received in the opening of the bend of the next succeeding tray and telescopically engaged therewith.

The sides of the tray include at least one finger extending outwardly from the floor. The finger defines with the edge of the board secured to the tray a guide member which engages the track of the burn-in chamber to prevent tilting of the tray.

In the preferred embodiment the burn-in tray is a planar substantially elongated tray comprising a floor having walls at either end connected to the floor by bends. The bends are characterized by at least one slot therein. The upper edge of each wall teminates with at least one tab having a camming surface which surface slopes upwardly and inwardly toward the opposed wall. The tabs are adapted to be received in the slots of a bend of a next succeeding burn-in tray. The cam surface guides the tab into the slot until seated. When seated the trays are then secured one to the other and movement along any axis is prevented.

Formed on the sides of the floor are fingers extending outwardly and downwardly with reference to the plane of the floor. When the board is secured to the tray the edge of the board defines with the fingers a guide member. When the tray is inserted in the burn-in chamber the tracks in the chamber are straddled by the guide members.

BRIEF DESCRIPTION OF THE PREFERRED EMBODIMENT

The preferred embodiment of the invention will be described in reference to an integrated circuit board secured to the burn-in tray of my invention. The integrated circuit board will be illustrated comprising a plurality of sockets arranged in parallel relationship for receiving semiconductor devices. It is to be understood that any suitable components may be arranged on the printed circuit board for burning-in.

Figure 1:
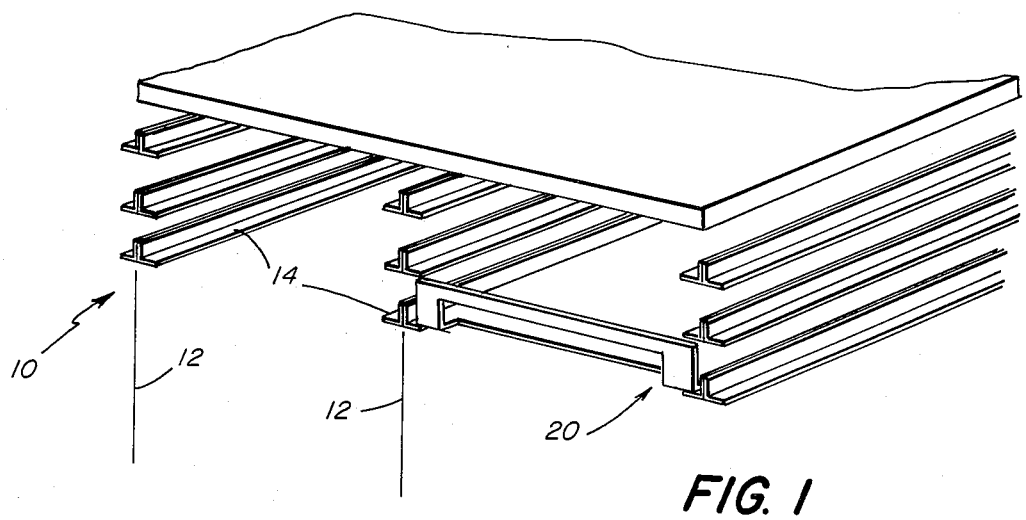
FIG. 1 is a perspective fragmentary illustration of a burn-in chamber in which burn-in trays embodying my invention are shown.

Referring to FIG. 1, a burn-in chamber is shown generally at 10 and includes vertical support members 12 to which are secured opposed pairs of parallel tracks 14 on which are received burn-in trays 20.

Figure 2:
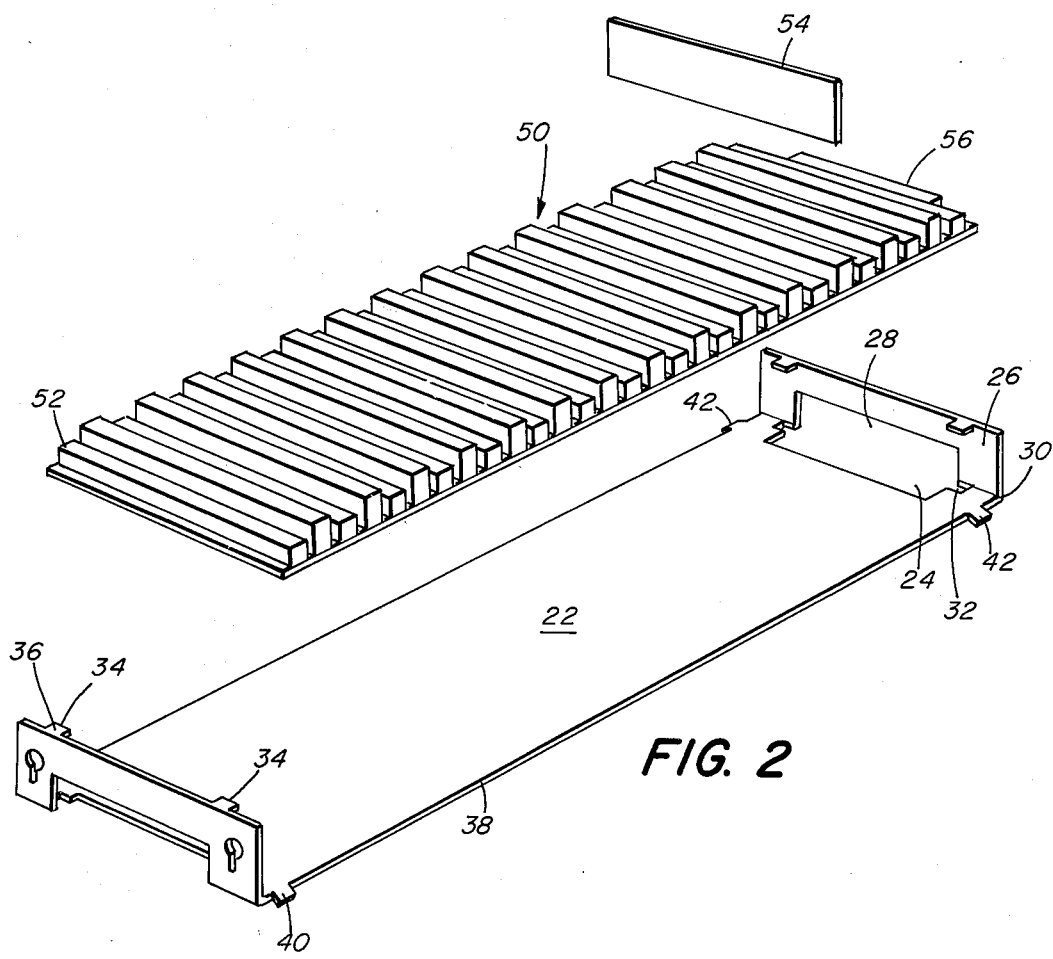
FIG. 2 is a perspective illustration of a burn-in tray embodying the preferred embodiment of my invention.

Referring to FIG. 2, a burn-in tray 20 is shown and comprises a floor 22 having recesses 24 at either end thereof. Walls 26 including recesses 28 extend upwardly from the floor 22 and are joined thereto by bends 30. The bends 28 are characterized by slots 32. The upper edges of the walls 26 include tabs 34 having camming surfaces 36 which extend upwardly and inwardly toward the opposed wall.

The floor 22 includes downardly extending sides 38 and outwardly and downwardly extending figures 40 and 42 at either end thereof.

A printed circuit board 50 comprises a plurality of sockets 52 in parallel relationship in which are received cards 54. An edge connector 56 is secured at the end of the board 50.

Figure 3:
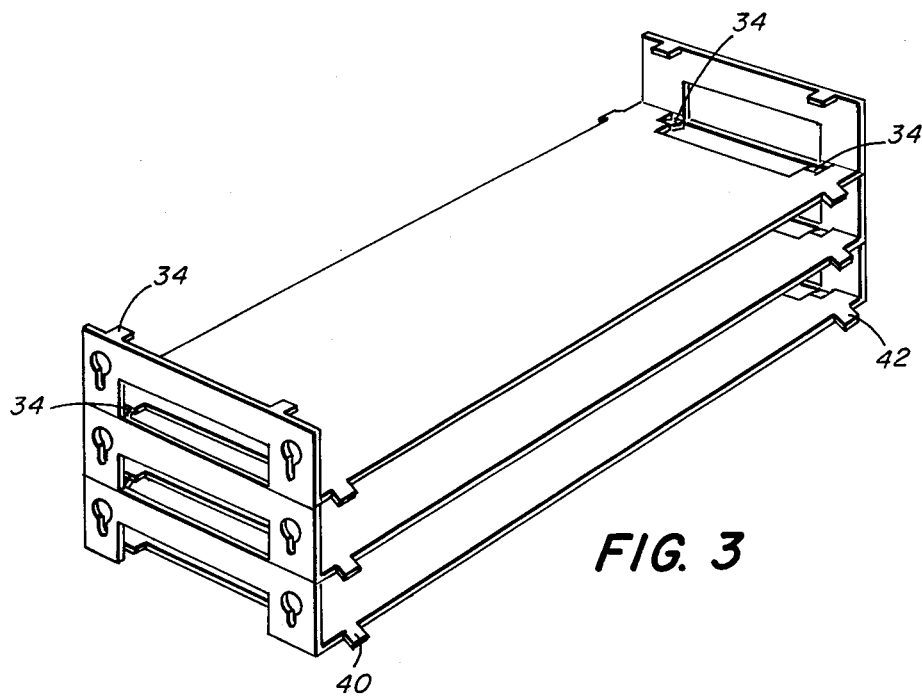
FIG. 3 is a perspective illustration of the locking and stacking concept of the burn-in trays; and, FIGS. 4a and 4b are front and side views of the tray.

Referring to FIG. 3, three burn-in trays 20 are shown. The camming surfaces 36 of the tabs 34 are adapted to engage at least a portion of the slots 32 formed in the bends 30. When the tabs 34 are received in the slots 32 the trays 20 are seated and movement between trays 20 in any lateral direction is prevented. The upper edges of the walls of a first tray 20 are of the same height and are of sufficient height to ensure that the floor 22 of a next upper succeeding tray will not contact any of the components on the board 50 of the first tray.

Figure 4A:
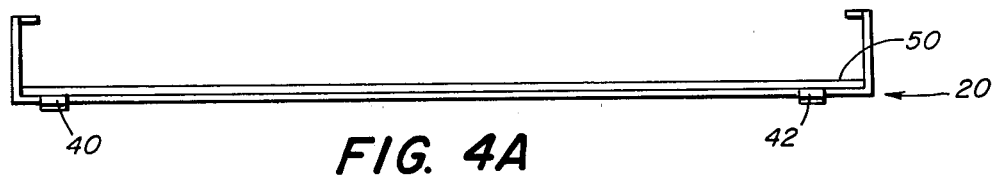
Figure 4B:
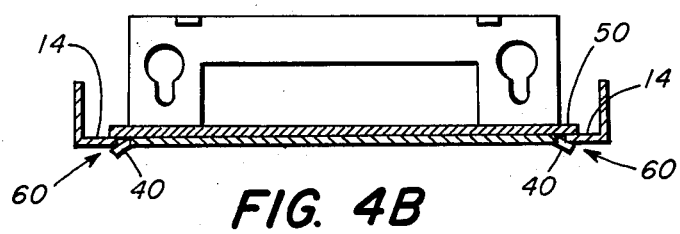

Referring to FIGS. 4a and 4b, when the board 50 is joined to the tray 20 the edges of the board 50 combine with the fingers 40 and 42 to form guide members 60 (only one pair shown). The guide members 60 straddle the opposed tracks 14 and prevent tilting of the tray 20 while being inserted into and removed from the burn-in chamber 10.

As shown in FIG. 2, the recess 24 in the floor 22 allow for the connector 56 at the end of the printed circuit board 50 to extend below the floor of the tray 20. Further the recess 28 in the walls 26 allow an operator to be able to handle the tray for its insertion or removal into or from the chamber 10 or for carrying of the tray(s) alone or in a stacked condition.

Various modifications to the preferred embodiment, will occur to those skilled in the art. One or more than two tabs may be used and they may assume a different configuration. The guide member may be formed solely on the tray without the board combining with the finger(s). For example a finger(s) extending outwardly substantially in the same plane as the floor could be used in lieu of the board to form the guide member(s).

Having described my invention, what I now claim is:

1. A stackable burn-in tray for printed circuit boards adapted for removable insertion in a burn-in chamber, the burn-in chamber having paired opposed tracks to receive the tray which comprises:
    a floor having two opposed sides and two opposed ends,
    walls joined to the ends by bends, the bends having at least one slot therein, tabs joined to the upper edges of the walls and having a camming surface, the tabs of a first tray adapted to be received in the slots of a next succeeding upper tray to allow stacking of the trays and to prevent relative lateral movement of the trays one to the other,
    guide members extending outwardly from the sides of the floor and adapted to engage the tracks of the burn-in chamber, the members positioned to prevent tilting of the tray when inserted into and removed from the chamber.
2. The tray of claim 1 wherein the floor at either end thereof includes recesses and the lower portions of the walls include recesses.
3. The tray of claim 1 wherein the tabs include a pair of tabs on the upper edge of each wall.
4. The tray of claims 1 or 3 wherein the tray is adapted to be secured to a board, the board having outer edges which extend beyond the sides of the tray, the tray including
    fingers extending laterally outward from the sides and adapted to define with the outer edges of the board the guide members.
5. The tray of claim 4 which includes fingers at either end of the tray.
6. The tray of claim 1 which includes a plurality of trays, the walls of a first tray of equal height and in register with the slots in the bends of the next successive upper tray whereby the trays may be secured in stacked condition.

* * * * *